United States Patent [19]

Shaw

[11] Patent Number: 5,574,880

[45] Date of Patent: Nov. 12, 1996

[54] MECHANISM FOR PERFORMING WRAP-AROUND READS DURING SPLIT-WORDLINE READS

[75] Inventor: Jeng-Jye Shaw, Palo Alto, Calif.

[73] Assignee: Intel Corporation, Santa Clara, Calif.

[21] Appl. No.: 212,136

[22] Filed: Mar. 11, 1994

[51] Int. Cl.$^6$ .......................... G06F 12/06; G11C 11/407
[52] U.S. Cl. ............... 395/431; 365/230.03; 365/230.06; 395/481; 364/249; 364/DIG. 1
[58] Field of Search ...................................... 395/403, 405, 395/411; 365/230.03, 230.06, 238.5; 345/200, 201

[56] References Cited

U.S. PATENT DOCUMENTS 5,257,235  10/1993  Miyamoto ........................... 365/230.03

Primary Examiner—Eddie P. Chan
Assistant Examiner—Kevin L. Ellis
Attorney, Agent, or Firm—Blakely, Sokoloff, Taylor & Zafman

[57] ABSTRACT

A memory with at least two banks, each bank capable of storing $N=2^n$ unique lines of data, each lines of data addressable by an n-bit code corresponding to an address index i, $0 \leq i \leq N-1$, provides for operation in either an OR-line or split-line mode. In the OR-line mode, data from line i, corresponding to index i, is available from all banks. In the split-line mode, data is available from line address i of one set of banks, and address i+1 from another set of banks. In either mode, wrap-around from line address i=N−1 to i=0 is provided by the use of an additional line of memory located at a position corresponding to i=N that contains the same data as the line corresponding to i=0. In this manner, a complete wrap-around read capability is provided without suffering a memory speed loss.

9 Claims, 8 Drawing Sheets

Fig. 8

| INPUT | | | | OUTPUT | | | | | | | | |
|---|---|---|---|---|---|---|---|---|---|---|---|---|
| LINE ADR CODE | | | | ADDRESS LINE STATE | | | | | | | | |
| c | n | | | 0 | 1 | 2 | 3 | 4 | 5 | 6 | 7 | 8 |
| 0 | 0 | 0 | 0 | 1 | | | | | | | | |
| 0 | 0 | 0 | 1 | | 1 | | | | | | | |
| 0 | 0 | 1 | 0 | | | 1 | | | | | | |
| 0 | 0 | 1 | 1 | | | | 1 | | | | | |
| 0 | 1 | 0 | 0 | | | | | 1 | | | | |
| 0 | 1 | 0 | 1 | | | | | | 1 | | | |
| 0 | 1 | 1 | 0 | | | | | | | 1 | | |
| 0 | 1 | 1 | 1 | | | | | | | | 1 | |
| 1 | 0 | 0 | 0 | 1 | | | | | | | | |
| 1 | 0 | 0 | 1 | | 1 | | | | | | | |
| 1 | 0 | 1 | 0 | | | 1 | | | | | | |
| 1 | 0 | 1 | 1 | | | | 1 | | | | | |
| 1 | 1 | 0 | 0 | | | | | 1 | | | | |
| 1 | 1 | 0 | 1 | | | | | | 1 | | | |
| 1 | 1 | 1 | 0 | | | | | | | 1 | | |
| 1 | 1 | 1 | 1 | | | | | | | | | 1 |

MECHANISM FOR PERFORMING WRAP-AROUND READS DURING SPLIT-WORDLINE READS

FIELD OF THE INVENTION

This invention relates to addressing of a random access memory (RAM). A memory structure avoids special addressing provisions at a RAM edge by providing a novel wrap-around capability without sacrificing memory read bandwidth for use in computer systems with a tendency for sequentially ordered stored instructions and data.

BACKGROUND OF THE INVENTION

Many computer systems exhibit a propensity to access instructions and data from selected regions of memory in a highly sequential order. If a memory boundary should fall within such a region resulting in data wrap-around from the highest memory address to the lowest, the natural sequence of addressing by increments is destroyed. Thus, the accessing of the upper address followed by the lowest address requires the introduction of special conditions to the memory accessing procedure causing decreased efficiency in the utilization of memory.

For example, modern microprocessor chips often contain an on-chip cache memory for instruction and data in order to increase the effective memory bandwidth of a bulk storage main memory system.

The increase in apparent bandwidth of the slower bulk storage mean memory is achieved by taking advantage of a characteristic that is generally found in instruction programs, namely: most references to memory, particularly over a short interval of time, tend to access certain memory neighborhoods of instruction memory. These neighborhoods, or reference localities, tend to move about as the program progresses. By storing these reference localities in a fast cache memory, the apparent speed (bandwidth) of memory can be increased by virtue of the reduced access time. From time to time, new reference localities must be transferred from bulk storage to cache as the pertinent reference locality shifts in the bulk storage main memory or when jumps must be made to accommodate subroutines, for example. Whenever, a required instruction program segment is not found in cache memory, an access must be made to main memory and the pertinent data transferred to cache. This new pertinent data generally displaces an older segment.

FIG. 1 shows a typical memory map from a main memory to a cache memory as used in a virtual memory system. FIG. 1, portion a, shows the accessible bulk memory segmented into $2^N$ pages. Each page may typically be 2 or 4 B (bytes) wide and 1 or 2 KB deep. The relative beginning address of each page is indicated to the left.

FIG. 1, portion b, shows a cache memory map for a cache memory having a capacity to store an integer number of pages, in which pages m and m+1 are stored in the page locations indicated by the solid arrows emanating from main memory. The two pages, shown as being transferred to contiguous locations in cache memory, in the general case, may be stored in any order. However, it is not uncommon for the reference locality to be located in adjacent pages as indicated by the shaded regions of page m and m+1 so that it is desirable to store contiguous main memory pages in contiguous segments of cache memory in order to simplify addressing of cache memory by its associated microprocessor (CPU). FIG. 1, portion c, shows a common situation in which page m is stored at the upper edge of cache memory and consequently page m+1 is "rolled-over" into lower memory as shown by the dash lines emanating from the main memory of FIG. 1, portion b, to cache memory of FIG. 1, portion c. If this situation occurs, addressing problems arise because of the discontinuity in addresses within the current reference locality. This situation is particularly undesirable when split-wordline read, rather than OR-line read is used as an accessing scheme to cache memory.

FIG. 2 shows a typical 2-bank RAM. Bank-0 comprises a memory unit 20, m-write amplifier unit 22, and m-sense amplifier unit 24. Similarly bank-1 comprises memory unit 21, m write amplifier unit 23, and m-sense amplifier unit 25. Each memory unit (20, 21) has an m-bit wide line and $N=2^n$ lines. The memory units are addressed by an n-bit code $(A_{n-1} A_{n-2} \ldots A_0)$ through line select decoder 10 which has N output lines. The input line code $(A_{n-1} A_{n-2} \ldots A_0)$ designates one-out-of-N of the output lines to be activated, so that the activated line enables a read or write operation to the corresponding line. In this two-bank configuration, a read causes sense amplifier 24 and 25 to read a line from bank-0 and bank-1, respectively, so that either or both outputs may be used.

FIG. 3(a) and (b) shows the logical configuration of a typical line select decoder 10. In FIG. 3(a), input line code terminals $(A_{n-1} A_{n-2} \ldots A_0)$ apply the input line code to a logic array comprising N multiple-input AND-gates, one for each output lines labeled 0 through $2^n-1$. Each AND-gate input 12, designated in FIG. 3 by the x-symbol, has one input for every bit of input line code. Inverter 11 is used to generate the logical complement of each input line code bit. A particular line with binary code index of $(a_{n-1} a_{n-2} \ldots a_0)$, where an is a binary bit, is selected to be active by applying a corresponding binary code to input terminals $A_{n-1} A_{n-2} \ldots A_0$ so that line $a_{n-1} a_{n-2} \ldots a_0$ is true high, if, any only if code $a_{n-1} a_{n-2} \ldots a_0$ is applied. For example, line 6 (binary 0 ... 0110) is active when the input code at $A_{n-1} A_{n-2} \ldots A_0$ is 0 ... 0110.

FIG. 3(b) shows a 3-bit line decoder 10 with the multiple input AND-gate 27 shown explicitly for producing 8 fully decoded output lines. Another useful mode for operating a memory is called the split-line mode. To explain the difference between OR-line and split-line modes, refer to FIG. 2. If the input code corresponds to line i, and the memory is in the read mode, line-select decoder 10, activates line causing line i to be read from each bank as described above. However, if the memory is being operated as an instruction cache, the split-line operating mode provides a means for reading data from, say, line i of bank-0 and line i+1 of bank-1 with a minimum delay. This mode is important because of the important property of locality of memory neighborhoods.

One obvious way to implement a split-line read is to address line i and read, say, bank-0 and then increment the input line-code by one, and then read line i+1 from bank-1. The problem with this method is that the access requires sequential addressing and an incrementing or add-operation with the associated inherent propagation delay due to carries.

In order to achieve maximum effective bandwidth of the memory, a line address decoder of the type shown in FIG. 4 has been used. (It should be noted that in the following example, the memory is limited to 3 bits, or N=8 decoded lines for the sake of clarity in explanation and does not imply a limitation as to size. Extension of the principles to N=8 will be apparent to those practicing the art.) The line decoder 40 is the same as shown previously as decoder 10 of FIG. 3(a) and (b) except that the decoded output lines 0–7 are further operated-on by split line selector 45 which comprises one 2-input selector 13 per output line. One input is connected to the output line, say i of decoder 10, normally associated with its output terminal i, while the other is connected to line i–1 of decoder 10. The output is selected by control line 41 which connects to lower input of each selector 13 when in one state and to the upper input of each selector 13 when the other state. The lower input of the line 0 selector is connected to the i–1=N–1 line (or 7 line in the example shown). Thus, these connections effectively arrange the output to correspond to a modulo-N ring counter by causing (N–1)+1 to be equal to N mod N. The disadvantage of decoder 40 is that for large memory arrays having in the order of 2K lines (or more), the circuit layout required to accommodate the connection from line N–1 of decoder 10 to the lower input of selector 13 associated with line 0 introduces an undesirably long lead and causes a loss in effective bandwidth as a result. The present invention is directed to providing both OR-line and split-line cache memory operation without the limitations described above.

SUMMARY OF THE INVENTION

It is the object of the current invention to provide a means for providing a cache memory system where contents are addressable in an OR-line or split-line mode and to provide a wrap-around addressing mode without any penalty in memory read bandwidth.

BRIEF DESCRIPTION OF THE DRAWINGS

The present invention may be understood more fully from the detailed description given below and from the accompanying drawings of the preferred embodiments of the invention which, however, should not be taken to limit the invention to the specific embodiment but are for explanation and understanding only.

FIG. 8 is a truth table showing the relationship between the line address code applied to line select decoder, the state of the mode control lines, and the state of the decoded output lines.

DESCRIPTION OF THE PREFERRED EMBODIMENT(S)

Although the following description of the invention is based on a memory system having eight lines/bank, it should be recognized that this is being done in order to more clearly described the essence of the invention without introducing unnecessary details. It should be apparent to those of ordinary skill in the art that the principles described may be scaled to accommodate more lines. Similarly, the number of memory banks has been limited because it is sufficient to describe the invention. Scaling of the inventive memory system to accommodate more banks may also be readily accomplished.

Figure 5:
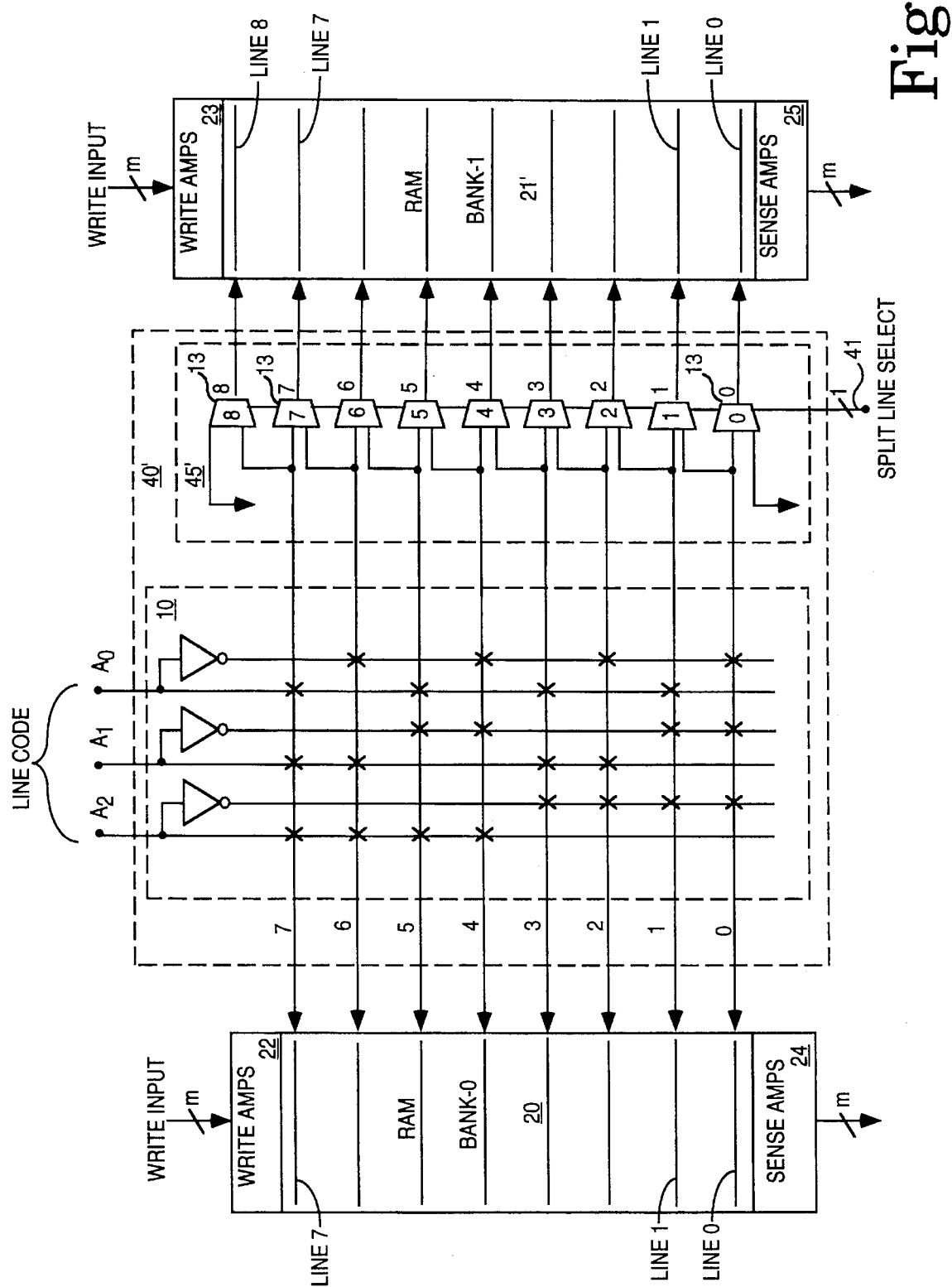
FIG. 5 is a block diagram of a two-bank memory system incorporating both OR-line and split-line read using an N+1 line memory unit in an embodiment of the present invention.

FIG. 5 shows a 2-bank memory system comprising an address line decoder 40'; and two banks, bank-0 and bank-1. Bank-0 includes an m-bit write amplifier assembly 22, a bank-0 random access memory (RAM) 20 that is m-bits wide and has N=8 lines, and m-bit sense amplifier assembly 24. Bank-1 is similar having write amplifier and sense amplifier assemblies 23 and 25, respectively, and bank-1 RAM 21' having N+1=9 lines, each line being m-bits wide.

Address line decoder 40' includes a line decoder 10, as previously described, that accepts n–3 bits as an address line code on terminals $A_2$, $A_1$, $A_0$, and activates the one-out-N (N=8) lines labeled 0–7. The N output lines are connected directly to bank-0 RAM 20 and indirectly through split-line network 45' to bank-1 RAM 21' via the N+1=9 output lines of split-line network 45' that are labeled 0–8.

Network 45' includes N+1=9 two-input selectors 13 indexed 0–8. Line-decoder 10 output line i connects to the upper input of selector 13, index-i, and the lower input of selector 13, index-i, is connected to output line i–1 of line-decoder 10, except that upper input of selector 13, index-N (N=8), and lower input of selector 13, index-0, is tied to the logic low level. The logic level of binary control line 41 selects the lower input terminal of each selector 13 when in one state and the upper input terminal when in the other state.

Figure 1:
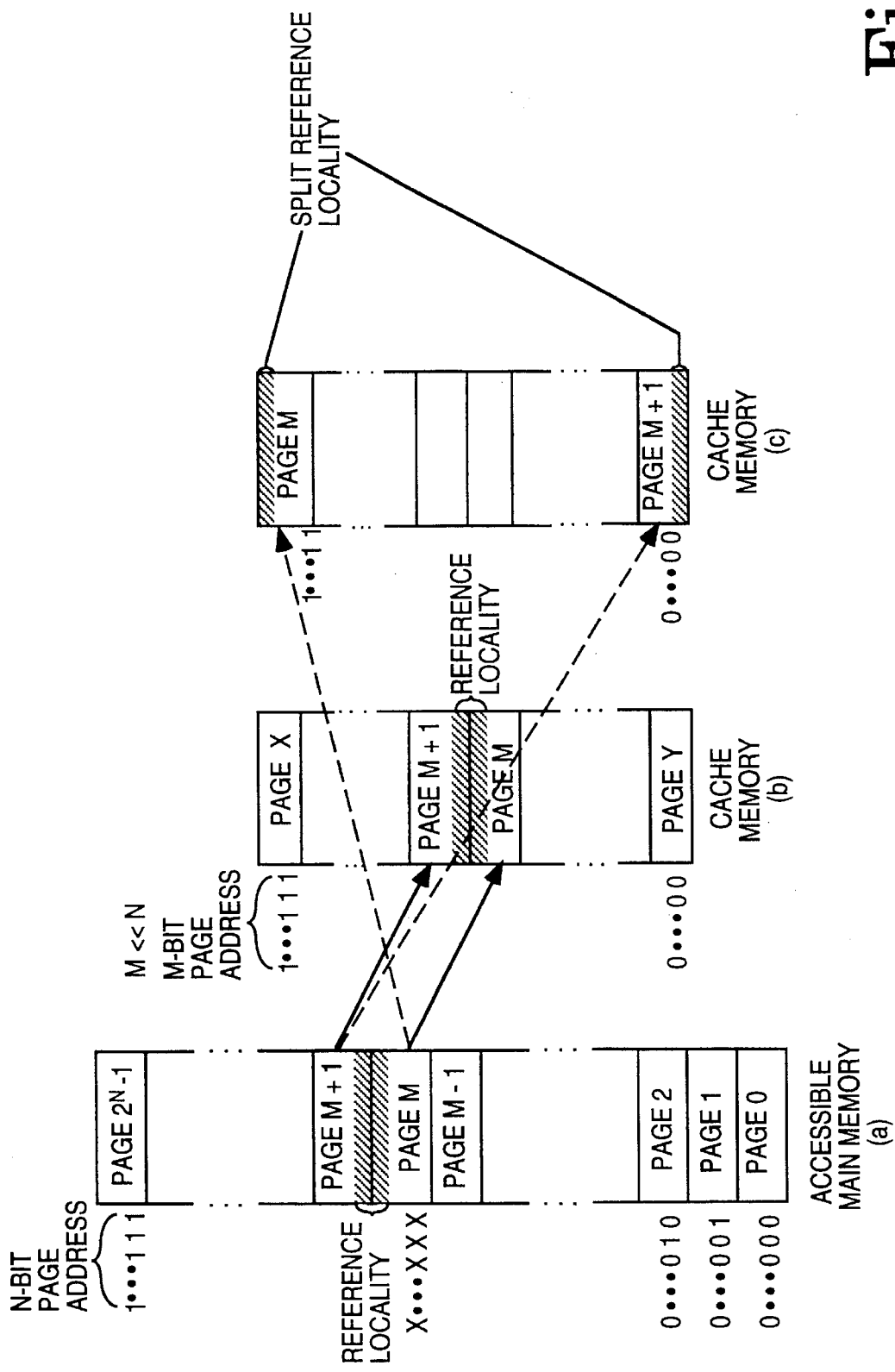
FIG. 1 shows a-typical memory mapping from a main memory to a cache memory in the prior art.
Figure 2:
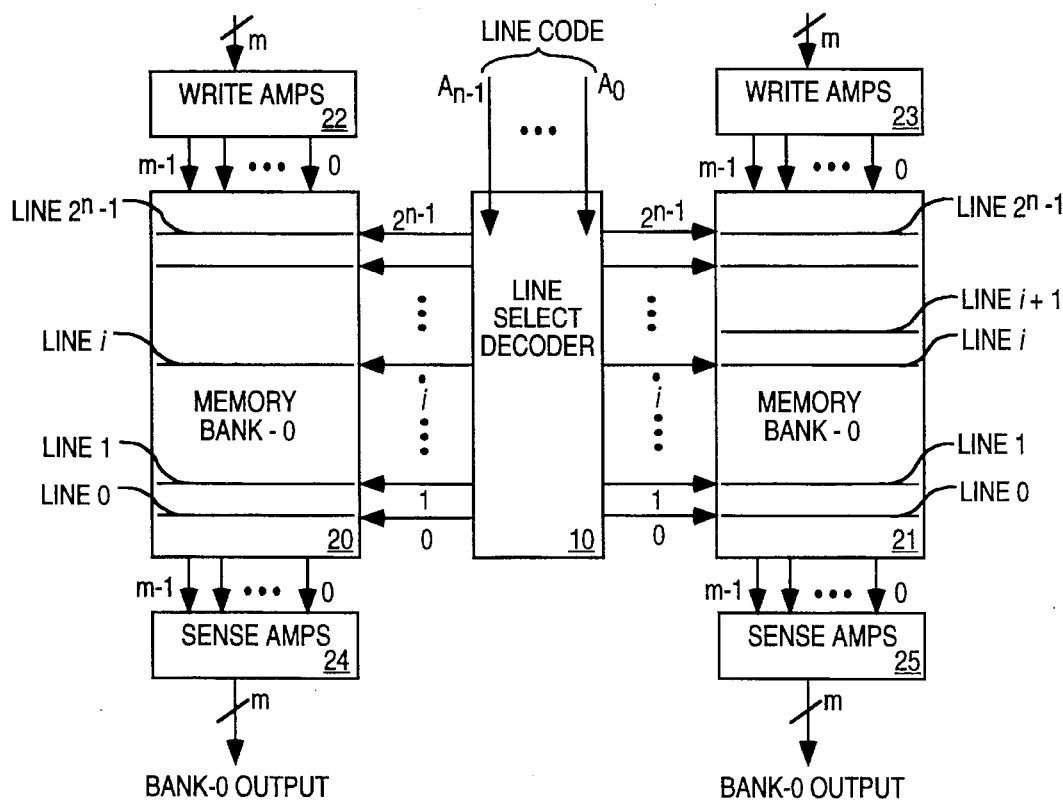
FIG. 2 shows a/typical two-bank memory in the prior art.
Figure 3A:
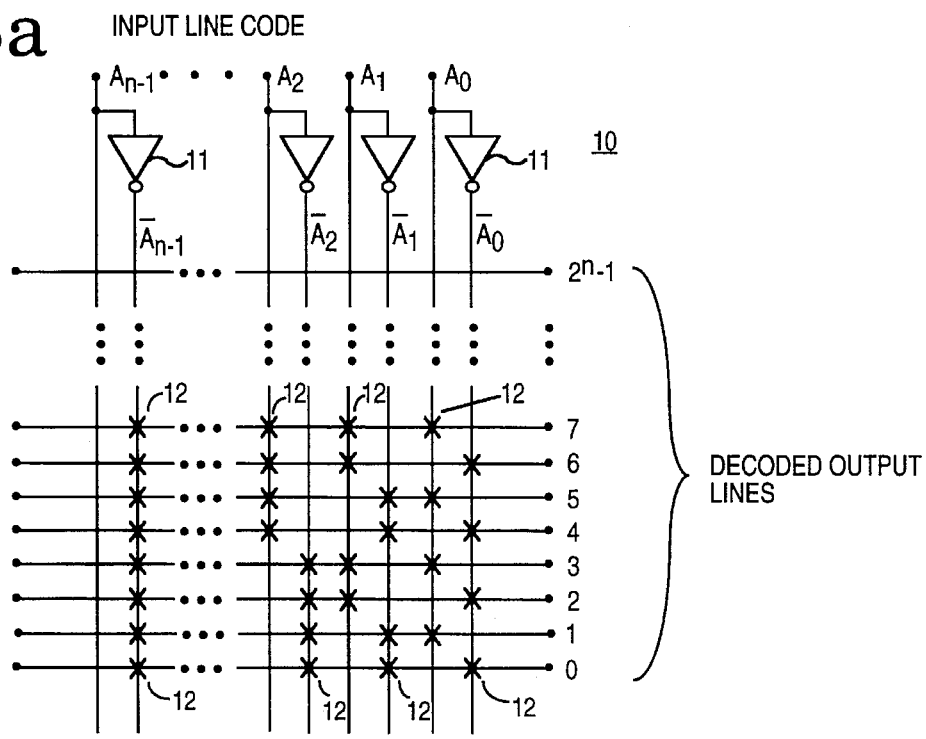
FIG. 3, is a logic diagram of a typical line select decoder in the prior art.
Figure 3B:
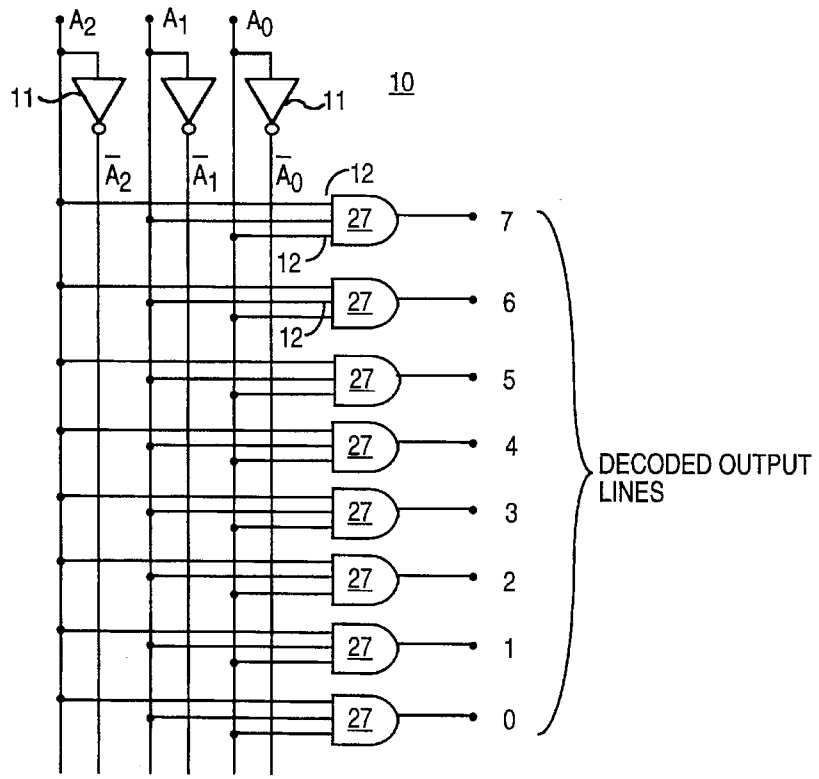

If the memory is to be operated in the OR-line mode, control line 41 selects the upper input of each selector 13. This disables output line 8 of network 45' and the FIG. 5 memory system operates as the full equivalent to that of FIG. 2.

Figure 4:
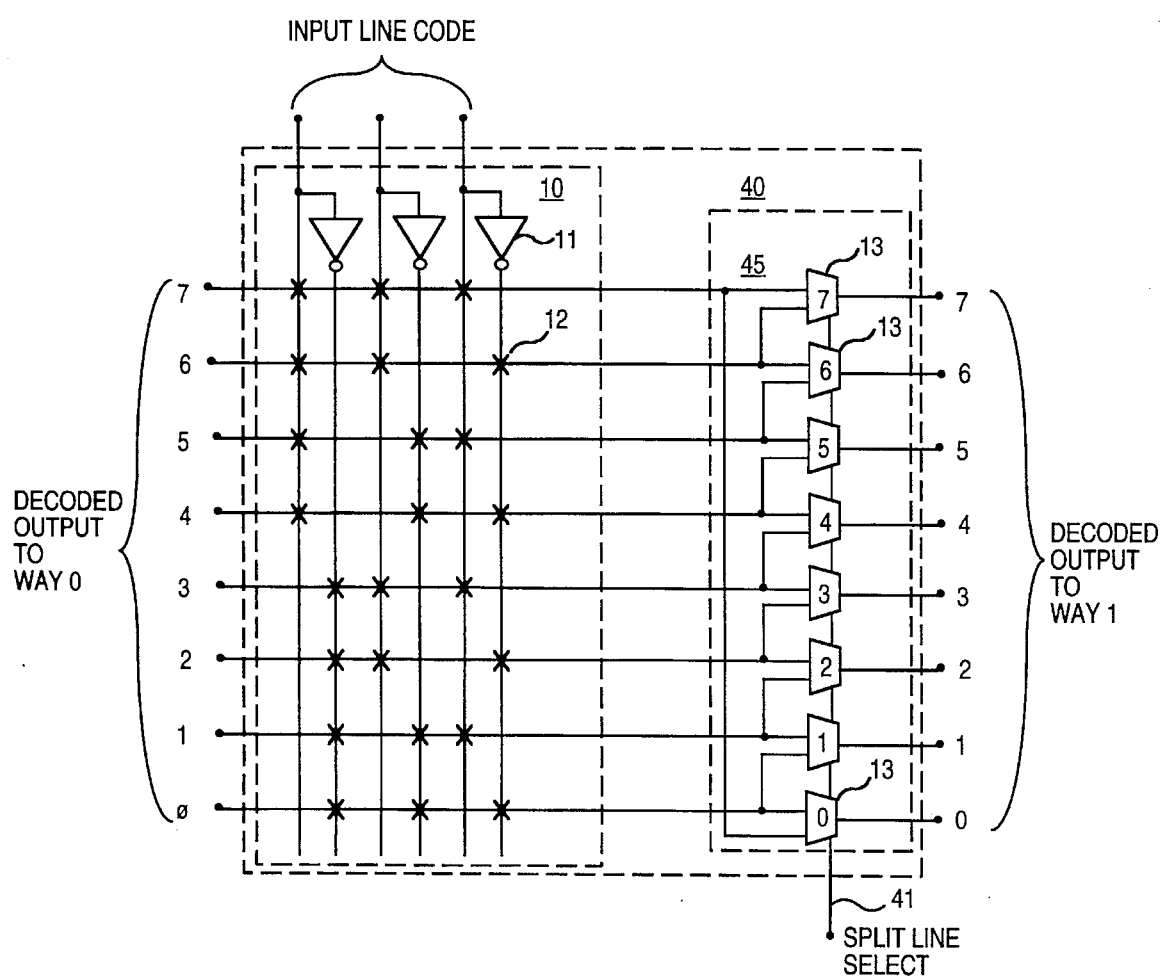
FIG. 4 is a logic diagram of a 3-bit input line decoder with 8-output lines for both OR-line and split line decoding.

If the state of selector control line 41 selects the lower input of each selector 13, the memory system of FIG. 5 operates in the split-line mode, i.e., if line i of decoder 10 is activated, line i of RAM 20 (bank-0) is enabled while line i+1 if RAM 21' (bank-1) is enabled and line 0 of RAM 21' is disabled. If line 8 is made to have the same data stored as line 0, then split-line read is accommodated without introducing a lengthy circularizing connection as in FIG. 4.

This arrangement implies that a write to line 0 of RAM 21' requires an additional write to line N (N=8 in this example). However, complete symmetry of memory access to memory in the split-line mode is maintained.

Figure 6:
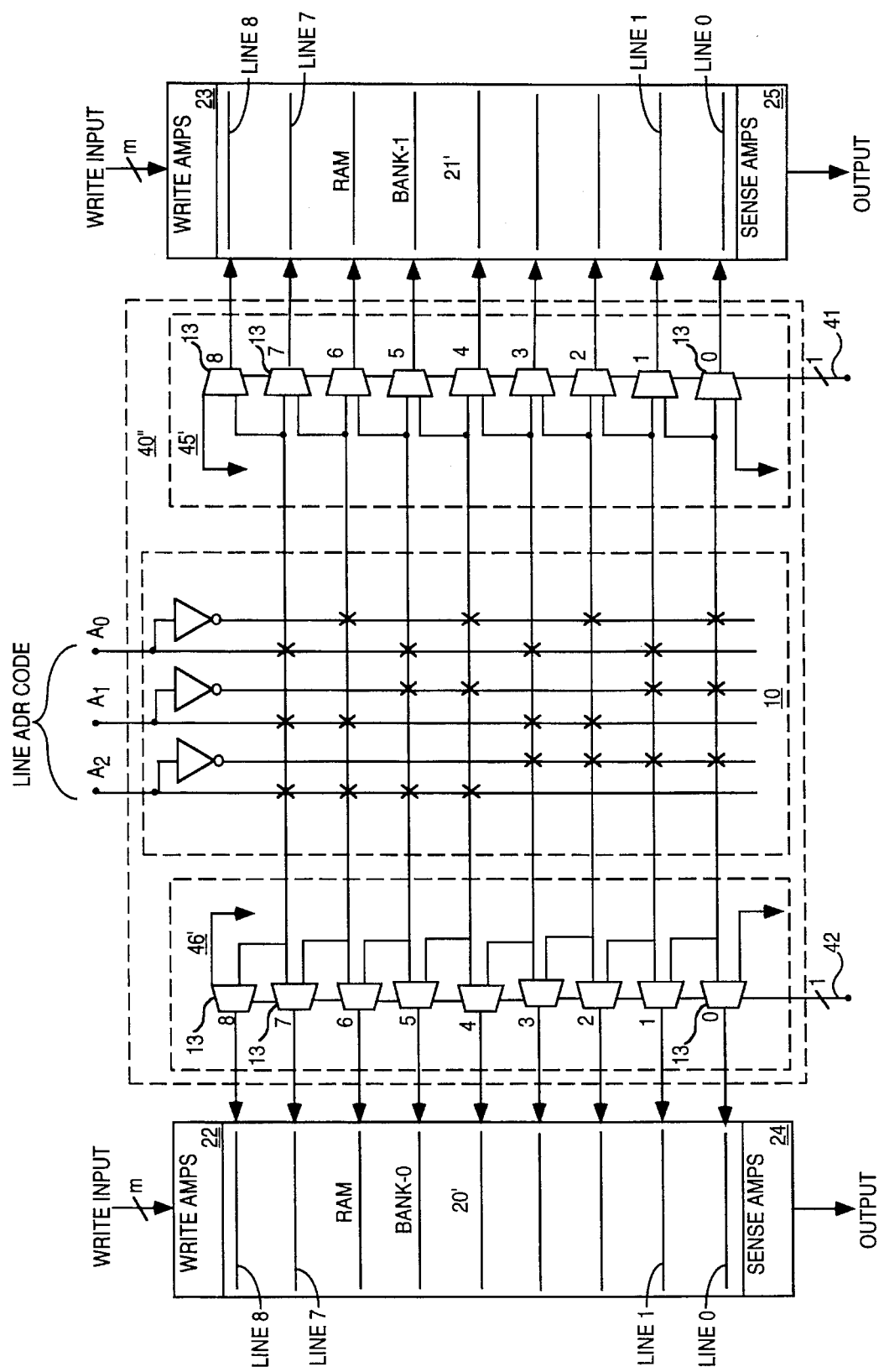
FIG. 6 is another block diagram of a two-bank memory system symmetrically incorporating split-line read in an embodiment of the present invention.

FIG. 6 shows a RAM line decoder 40" that is symmetrical, providing split-line access to either bank-0 or bank-1 by the addition of network 46'. Control line 42 functions the same as control line 41 does with respect to network 45'. Selectors 13 of network 46' select either the lower or upper inputs to selectors 13 based upon the state of the binary control signal applied to line 42. In addition, RAM 20' (bank-0) has been modified so that, like RAM 21' (bank-1) it has an additional line N (N=8, in the example of FIG. 6). This configuration allows complete flexibility in operating the cache memory. In the split-line mode, either RAM 21' or RAM 20' may be accessed at line i+1, when the line address code has a value of i. Also, when operating in the OR-line mode, complete wrap-around may be accomplished when incrementing through both RAMs by advancing from line (N–1) to line N by changing the state of control lines 41 and 42 so that the lower inputs to selectors 13 are selected when the line address value is N−1 (N−1=7, in the example of FIG. 6) causing line N (N=8 in the example) of both RAMs to be enabled. If line N is made to have the same contents as line 0, the resulting access would be the same as if a wrap-around from line (N−1) to line 0 had been made.

Figure 7:
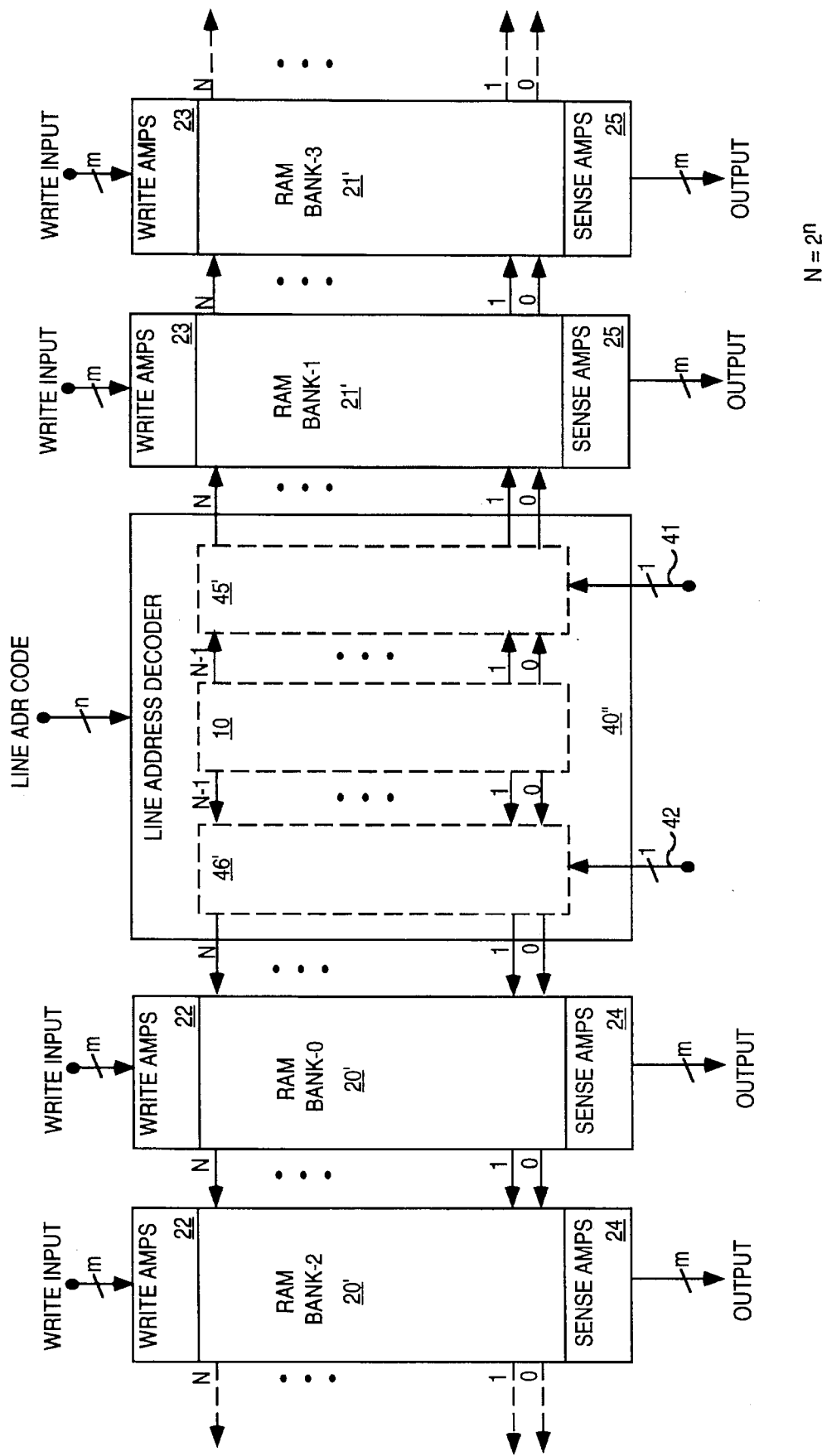
FIG. 7 is an example of a multibank memory with OR-line and split-line read in an embodiment of the present invention.

The address decoding apparatus 40" of FIG. 6 can be used to operate 4 or more banks as shown in FIG. 7. Line address decoder 40", essentially as shown in FIG. 6, accepts an n-bit line address code plus control lines 41 and 42 to provide selective activation of N+1 control lines (0, 1, ..., N), where N=$2^n$. The split-line feature for the left side RAMs (0, 2, ...) are controlled by line 42 and the right side RAMs (1,3, ...) by line 41. All left side RAM lines are activated by the N+1 output lines of network 46' while the right side RAMs are activated by the N+1 output line of network 45'. OR-line wrap-around from line (−1) to line 0 is accomplished for all RAM banks by incrementing all banks by advancing form line (N−1) to line N by charging the state of control lines 41 and 42 as previously described with respect to FIG. 6.

FIG. 8 is a truth table showing the relationship between the line address code applied to decoder 40;, the state of mode control line 41 or 42, and the state of the (N+1) decoded memory line select control liens generated by decoder 40'. The line index code n and either mode control line 41 and 42, designated as a "c"-bit in the first three columns of FIG. 8 represent all possible states of the input control signals (a 3-bit line index code is assumed in the example. The state of the N+1=9 decoded memory-line-select control lines are shown in the 9 right-hand columns where a "1" represents an active output state for enabling a memory access to its corresponding RAM line and the absence of a "1" indicates the inactive logic state.

From FIG. 8 it is clear that the OR-line mode is achieved by having the mode control bit C=0; the incremented-by-one mode for split-line operation is achieved by having mode control bit C=1, and the wrap-around operation is achieved by activating the mode control C-bit (C=1) after accessing line N−1 (line 7 of the example).

What is claimed is:

1. A memory line decoder for controlling access to a random access memory (RAM) with N+1 lines by selecting a line at a location specified by an n-bit binary coded line address represented by an index $i 0 \leq i \leq N-1$ where N=$2^n$, the memory line decoder comprising:

(a) a one-out-of-N decoder comprising,
      (i) input terminals accepting the n-bit binary coded line address, and
      (ii) logic means coupled to the input terminals, the logic means providing N ordered output lines wherein only the N ordered output line located at a position corresponding to the index i is activated; and
   (b) a first split-line network comprising,
      (i) a mode control line for accepting an externally applied binary control signal having a first and a second state; and
      (ii) logic means coupled to the mode control line for mode control and to the N ordered output lines of the one-out-of-N decoder, the logic means having (N+1) ordered output lines and selectively activates one-out-of-(N+1) ordered output lines for use in controlling access to a RAM line that is located at an address corresponding to the position of the activated one-out-of-(N+1) ordered output lines, the activated one-out-of-(N+1) ordered output lines being selected by mapping the activated one-out-of-N ordered output lines of the one-out-of-N decoder located at a position corresponding to the index i to the one-out-of-(N+1) ordered output lines of the first split-line network located at a position corresponding to the index i, when the split-line mode control line has an externally applied signal in the first state, otherwise mapping the activated one-out-of-N ordered output lines of the one-out-of-N decoder located at a position corresponding to the index i to the one-out-of-(N+1) ordered output lines of the first split-line network located at a position corresponding to the index i+1, when the mode control line has an externally applied signal in the second state, furthermore when the mode control line has the externally applied signal in the second state and the index i has a value of N−1, the one-out-of-(N+1) ordered output lines of the first split-line network located at the position corresponding to the index i+1 is activated, where the index i+1 has a value of N for a wrap-around read.

2. The memory line decoder of claim 1 further comprising a second split-line network connected to the one-out-of-N decoder output lines, for providing a second split-line network, each split line network with (N+1) ordered output lines, and each with an independently controllable mode control line.

3. An N-line memory system for selectively operating in either an OR-line mode or in a split-line mode, each line of the memory system being accessible by applying an n-bit binary coded address index i, $0 \leq i \leq N-1$ where N=$2^n$, the N-line memory system comprising:

(a) a multi-bank random access memory (RAM) including,
      (i) a first RAM having N lines of memory accessible by activating one-out-of-N address lines, and
      (ii) a second RAM having (N+1) lines of memory, accessible by activating one-out-of-(N+1) address lines; and
   (b) a line decoder for selectively accessing lines from said first RAM and said second RAM corresponding to the n-bit binary coded address index i in response to an externally provided mode control signal applied to a first mode control line such that when the first mode control line is in a first state the line decoder selects the line corresponding to the n-bit binary coded address index i from the first RAM and the second RAM, and when the first mode control line is in a second state the line decoder selects the line corresponding to the n-bit binary coded address index i of the first RAM and the line corresponding to the n-bit binary coded address index i+1 of the second RAM, when the first mode control line is in the second state and the n-bit binary coded address index i has a value of N−1, the one-out-of-(N+1) address lines of the second RAM located at a position corresponding to the index i+1 is accessed, where the index i+1 has a value of N for a wrap-around read.

4. The N-line memory system of claim 3 wherein the multi-bank RAM first RAM and second RAM each comprises at least one bank.

5. The N-line memory system of claim 4 wherein the first RAM bank has (N+1) lines of memory and the line decoder further comprises an externally controlled second mode control line such that when the binary coded address index has a value of i and the second mode control line is in a first state, the line decoder selects line i from the first RAM, and when in a second state, the line decoder selects line i+1 from the first RAM independent of the state of the first mode control line.

6. An N-line memory system for selectively operating in either an OR-line mode or in a split-line mode, comprising:

(a) a memory line decoder for controlling access to a multi-bank random access memory (RAM) with (N+1) lines by selecting a line of RAM at a location corresponding to an externally provided n-bit binary coded line address represented by an index i, $0 \leq i \leq N-1$, where $N=2^n$, and by selecting the OR-line mode or split-line mode of operation by means of a mode control line, the memory line decoder comprising:

(i) a one-out-of-N decoder comprising, (aa) input terminals accepting the n-bit binary coded line address; and (bb) logic means with an input coupled to the input terminals, the logic means providing N ordered output lines wherein only the N ordered output line located at a position corresponding to the index i is activated; and (ii) a first split-line network comprising, (aa) a mode control line for accepting an externally applied control signal having a first and a second state; and (bb) logic means coupled to the mode control line for mode control and coupled to the N ordered output lines of the one-out-of-N decoder, the logic means having (N+1) ordered output lines and selectively activates one-out-of-(N+1) ordered output lines for use in controlling access to a RAM line that is located at an address corresponding to the position of the activated one-out-of-(N+1) ordered output lines, the activated one-out-of-(N+1) ordered output lines being selected by mapping the activated one-out-of-N ordered output lines of the one-out-of (N) decoder located at a position corresponding to the index i to the one-out-of (N+1) ordered output lines of the first split-line network located at a position corresponding to the index i, when the split-line mode control line has an externally applied signal in the first state, otherwise mapping the activated one-out-of-N output lines of the one-out-of-N decoder located at a position corresponding to the index i to the one-out-of-(N+1) ordered output lines of the first split-line network located at a position corresponding to the index i+1, when the split-line mode control has an externally applied signal in the second state, furthermore when the mode control line has the externally applied signal in the second state and the index i has a value of N−1, the one-out-of(N+1) ordered output lines of the first split-line network located at the position corresponding to the index i+1 is activated, where the index i+1 has a value of N for a wrap-around read, (b) a multi-bank random access memory (RAM), including, (i) a first RAM bank having N lines of memory accessible by activating one-out-of-N address lines, the address lines connected to corresponding output lines of the one-out-of-N decoder, and (ii) a second RAM bank having (N+1) lines of memory accessible by activating one-out-of-(N+1) address lines, the address lines connected to corresponding output lines of the first split-line network.

7. The N-line memory system of claim 6 wherein the first RAM bank has N+1 lines of memory and further comprises a second split-line network, the second split-line coupled to the N ordered lines of the one-out-of-N decoder for providing a set of N+1 output lines coupled to corresponding address lines of the first RAM bank, for producing optional split-line mode addressing of the first RAM bank.

8. A method for operating an N-line multi-bank memory system wherein each bank has (N+1) memory lines, each line is addressed by an n-bit address code corresponding to a line address index i, $0 \leq i \leq N-1$, where $N=2^n$, the method comprising:

(a) writing lines of data to line addresses corresponding to the line address index i for $1 \leq i \leq N-1$, and writing a line of data corresponding to the line address index i for i=0 into both line 0 and line N; and (b) reading lines of data from line addresses corresponding to the line address index i by selecting either an OR-line read mode or a split-line read mode as follows:

(i) when OR-line read mode is selected, reading data in all banks from the memory lines corresponding to the line address index i and (ii) when split-line read mode is selected, reading data from a first set of banks from memory lines corresponding to the line address index i, and from a second set of banks from memory lines corresponding to the line address index (i+1), furthermore when the mode control line has the externally applied signal in the second state and the line address i has a value of N−1, the one-out-of-(N+1) ordered output lines of the first split-line network located at the position corresponding to the line address index i+1 is activated, where the line address index i+1 has a value of N for a wrap-around read.

9. The method of claim 8 wherein the OR-line read mode further comprises addressing modulo-N wrap-around, by incrementing i=N−1 to i=N for providing access to data which is identical to that stored in line 0.